United States Patent
Kondo et al.

(10) Patent No.: US 8,917,152 B2
(45) Date of Patent: Dec. 23, 2014

(54) SPIN WAVE DEVICE

(75) Inventors: Tsuyoshi Kondo, Kawasaki (JP);
Hirofumi Morise, Yokohama (JP);
Shiho Nakamura, Fujisawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 380 days.

(21) Appl. No.: 13/487,769

(22) Filed: Jun. 4, 2012

(65) Prior Publication Data

US 2012/0280769 A1    Nov. 8, 2012

Related U.S. Application Data

(63) Continuation of application No. PCT/JP2010/050624, filed on Jan. 20, 2010.

(51) Int. Cl.
*H01P 1/203*    (2006.01)
*H01P 1/215*    (2006.01)
*H03C 1/34*    (2006.01)

(52) U.S. Cl.
CPC ............. *H01P 1/20345* (2013.01); *H03C 1/34* (2013.01); *H01P 1/203* (2013.01)
USPC .......................................... 333/147; 333/202

(58) Field of Classification Search
CPC .......... H01P 1/203; H01P 1/215; H01P 1/218
USPC .......................................... 333/141, 147, 202
See application file for complete search history.

(56) References Cited

U.S. PATENT DOCUMENTS

| 4,679,012 | A | * | 7/1987 | Buck | ............................. 333/161 |
| 5,189,383 | A | * | 2/1993 | Murakami et al. | ............ 333/201 |

(Continued)

FOREIGN PATENT DOCUMENTS

| JP | 2005-176318 | 6/2005 |
| JP | 2007-124340 | 5/2007 |

OTHER PUBLICATIONS

International Preliminary Report on Patentability and Written Opinion issued Aug. 16, 2012 in PCT/JP2010/050624 filed Jan. 20, 2010.

(Continued)

*Primary Examiner* — Dean O Takaoka
*Assistant Examiner* — Alan Wong
(74) *Attorney, Agent, or Firm* — Oblon, Spivak, McClelland, Maier & Neustadt, L.L.P.

(57) ABSTRACT

A spin wave device according to an embodiment includes: an input interconnect transmitting an input impulse signal; a multilayer film including a foundation layer; a first magnetic layer formed on the multilayer film and generating spin waves when receiving the input impulse signal, the spin waves propagating through the first magnetic layer; a plurality of input electrodes arranged in a straight line on the first magnetic layer, being connected to the input interconnect, and transmitting the input impulse signal to the first magnetic layer; and a plurality of sensing electrodes sensing the spin waves, being arranged on the first magnetic layer, and being located at different distances from one another from the straight line having the input electrodes arranged therein, and the following equation is satisfied: $d = V_g \times t_0$.

8 Claims, 9 Drawing Sheets

(56) References Cited

U.S. PATENT DOCUMENTS

| | | | |
|---|---|---|---|
| 5,283,541 A * | 2/1994 | Okada et al. | 333/156 |
| 7,397,326 B2 * | 7/2008 | Naito et al. | 333/186 |
| 7,504,898 B2 * | 3/2009 | Fukuzawa et al. | 331/96 |
| 7,528,688 B2 * | 5/2009 | Srinivasan | 333/219.2 |
| 7,535,070 B2 | 5/2009 | Eshaghian-Wilner et al. | |
| 2007/0075806 A1 | 4/2007 | Naito et al. | |
| 2007/0109147 A1 | 5/2007 | Fukuzawa et al. | |
| 2008/0231392 A1 | 9/2008 | Kim et al. | |
| 2009/0096044 A1 | 4/2009 | Eshaghian-Wilner et al. | |
| 2010/0075599 A1 * | 3/2010 | Xi et al. | 455/41.2 |
| 2010/0225312 A1 | 9/2010 | Nakamura | |

OTHER PUBLICATIONS

International Search Report mailed Apr. 20, 2010, in PCT/JP2010/050624 filed Jan. 20, 2010 (in English).

Y.J. Ataiiyan, et al., "MSSW Transversal Filters Based on Current Weighting in Narrow (10 μm) Transducers", IEEE MTT-S Digest, 1986, pp. 575-578.

Sang-Koog Kim, et al., "A gigahertz-range spin-wave filter composed of width-modulated nanostrip magnotic-crystal waveguide", Applied Physics Letters, Aug. 24, 2009, vol. 95, No. 8, 4 pages.

P. Kabos, et al., Magnetostatic Waves and Their Applications, Chapter 8, "High-Frequency MSW Elements", 1994, 13 pages.

* cited by examiner

SPIN WAVE DEVICE

CROSS-REFERENCE TO RELATED APPLICATION

This application is a continuation of and claims the benefit of prior International Application No. PCT/JP 2010/050624 filed on Jan. 20, 2010, the entire contents of which are incorporated herein by reference.

FIELD

Embodiment described herein relate generally to a spin wave device.

BACKGROUND

There is a filter for high-frequency electrical signals using magnetostatic waves that are spin waves. Such a magnetostatic wave filter includes a yttrium iron garnet thin film (hereinafter also referred to as a YIG thin film) epitaxially grown on a gadolinium gallium garnet substrate (hereinafter also referred to as a GGG substrate), and a dielectric substrate having an electrical ground electrode along the entire lower surface and two metal thin-film transducers on the upper surface. In the magnetostatic filter, the surface of the YIG thin film adjacent to the transducers on the dielectric substrate.

A high-frequency electrical signal, input to the Input transducer, generates a high-frequency magnetic field in the surrounding area (in vicinity). The high-frequency magnetic field generated in the vicinity of the input transducer induces magnetic moment precession in part of the YIG thin film. The induced precession propagates as spin waves to the output transducer through the YIG thin film. The spin waves having reached the output transducer induce a high-frequency electrical signal in the output transducer through the reverse process of the process at the time of the input. As a result, the magnetostatic filter functions as a band-limiting filter that passes electrical signals in the frequency band of spin waves that are excited by the input transducer and can be sensed by the output transducer.

Also, there has been a report about a magnetostatic filter using an output transducer formed with electrodes. Input electrodes are arranged at different distances from one another from the input transducer. The design, in which the lengths of the electrodes and the direction of current flowing in the electrodes are specified, gives the filter desired frequency characteristics.

However, the these filters have integration issues. The wavelengths of magnetostatic waves to be generated depend on the size of the electrodes of the transducers. For that reason, it is difficult to miniaturize those filters. Furthermore, spin-wave propagation media used in those magnetostatic filters are required to have such characteristics that spin precession should have long life-time. Therefore, a YIG thin film has been most often used. This material is a very serious hindrance to integration of the filters into LSI circuits (large-scale integrated circuits) by a hybrid circuit technique or the like. A YIG thin film is a crystalline thin film epitaxially grown on a GGG crystalline substrate. Epitaxial growth on a specific crystalline substrate cannot be realized by conventional LSI manufacturing processes, and integration of magnetostatic filters into LSI circuits is practically impossible at present.

Magnetostatic filters also have problems in characteristics. The frequencies of signals to be processed with a filter are the same as spin wave frequencies, according to the operating principles of transducers. Therefore, the propagation characteristics of magnetostatic waves in a YIG thin film are directly reflected in the characteristics of the filter. This puts great restrictions on the filter design. For example, to design a band-limiting filter, the cutoff frequency is limited by the magnetostatic wave excitation and detection ranges of the transducers on the high frequency side, and is limited by the frequency bandwidth of magnetostatic waves on the low frequency side. Particularly, the latter depends on materials. Therefore, it is difficult to widen the frequency band toward the low frequency side, as long as a YIG thin film or a material similar to a YIG film is used.

DETAILED DESCRIPTION

A spin wave device according to an embodiment includes: an input interconnect transmitting an input impulse signal; a multilayer film including a foundation layer; a first magnetic layer formed on the multilayer film, the first magnetic layer generating spin waves when receiving the input impulse signal, the spin waves propagating through the first magnetic layer; a plurality of input electrodes arranged in a straight line on the first magnetic layer, the input electrodes being connected to the input interconnect, the input electrodes transmitting the input impulse signal to the first magnetic layer; and a plurality of sensing electrodes sensing the spin waves having propagated through the first magnetic layer, the sensing electrodes being arranged on the first magnetic layer, the sensing electrodes being located at different distances from one another from the straight line having the input electrodes arranged therein, wherein the following equation is satisfied:

$$d = Vg \times t_0$$

where n (n≥2) represents the number of the sensing electrodes, $L_i$ represents a distance of the ith (n≥i≥1) sensing electrode from the straight line, Vg represents a group velocity of the spin waves, $t_0$ represents a pulse period of the input impulse signal, and d represents a distance between the ith (n−1≥i≥1) sensing electrode and the (i+1)th sensing electrode adjacent to the ith sensing electrode in a direction perpendicular to the straight line.

The following is a description of embodiments of the present invention, with reference to the accompanying drawings.

First Embodiment

Figure 1:
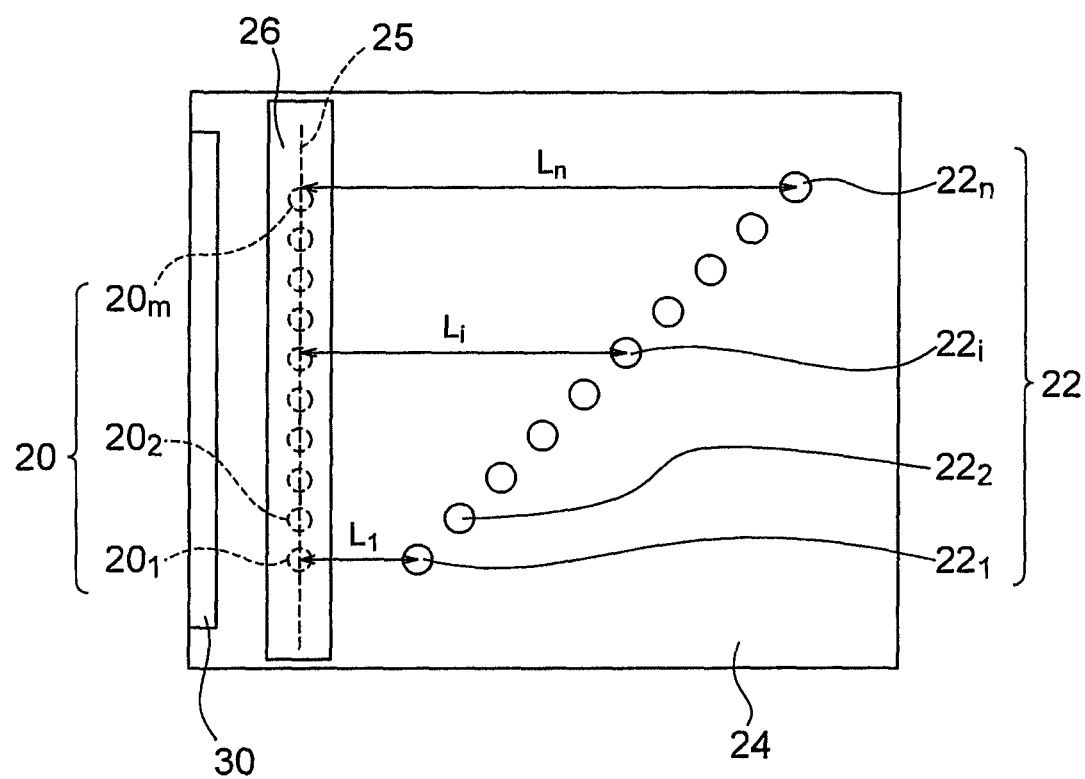
FIG. 1 is a top view of a spin wave device according to a first embodiment.
Figure 2:
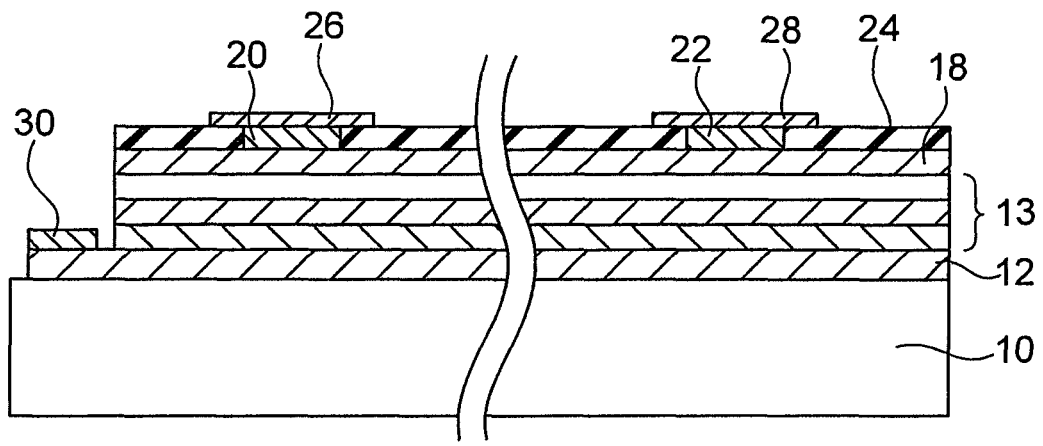
FIG. 2 is a cross-sectional view of the spin wave device according to the first embodiment.

A spin wave device according to a first embodiment is illustrated in FIGS. 1 and 2. FIGS. 1 and 2 are a top view and a cross-sectional view of the spin wave device 1 of this embodiment, respectively.

The spin wave device 1 of this embodiment is formed on a substrate 10, and includes: a conductive foundation layer 12 that is stuck on the substrate 10 and realizes a high-quality thin film; a multilayer stacked film 13 formed on a first region of the foundation layer 12 by stacking at least two thin films; and a magnetic layer 18 formed on the multilayer stacked film 13. As shown in FIG. 1, a set 20 of input electrodes $20_1$ through $20_m$ (m≥1) arranged in a straight line are formed on the magnetic layer 18, and a set 22 of sensing electrodes $22_1$ through $22_n$ (n≥1) arranged at different distances from one another from the input electrode set 20 are also formed on the magnetic layer 18. Here, the distances of the sensing electrodes $22_1$ through $22_n$ (n≥1) from the input electrode set 20 are the distance $L_i$ to the straight line 25 in which the input electrodes $20_1$ through $20_m$ (m≥1) are arranged, or the length $L_i$ of the perpendicular extending from the center of each sensing electrode $22_j$ (j=1, ..., n) to the straight line 25. Each input electrode $20_i$ (i=1, ..., m) and each sensing electrode $22_j$ (j=1, ..., n) have dot-like contact faces, and are connected to the magnetic layer 18 via the contact faces. Each input electrode $20_i$ (i=1, ..., m) and each sensing electrode $22_j$ (j=1, ..., n) can be in direct contact with the magnetic layer 18, or can be in contact with the magnetic layer 18 via a conductive layer (a cap layer described later). In this specification, "dot-like" shapes mean circular shapes, elliptical shapes, tetragonal shapes, polygonal shapes, or the like.

The input electrodes $20_1$ through $20_m$ and the sensing electrodes $22_1$ through $22_n$ are covered with an insulating layer 24, with the upper faces of those electrodes being exposed from the insulating layer 24. The input electrodes $20_1$ through $20_m$ having the upper faces exposed are electrically connected to an input interconnect 26 formed on the insulating layer 24, and the sensing electrodes $22_1$ through $22_n$ having the upper faces exposed are electrically connected to an output interconnect 28 formed on the insulating layer 24. Also, a GND electrode 30 electrically connected to the foundation layer 12 is provided on a second region of the foundation layer 12 on which the multilayer stacked film 13 is not provided. Although the GND electrode 30 is formed on the foundation layer 12 in this embodiment, the GND electrode 30 can be provided on a conductive layer of the multilayer stacked film 13 except for the uppermost layer.

The input interconnect 26 extends parallel to the array direction of the input electrodes $20_1$ through $20_m$, and is preferably designed to have a length at least twice longer than the wavelengths of spin waves generated by the current input to the input electrodes $20_1$ through $20_m$, so as to avoid influence of electromagnetic induction caused by input electrical signals.

The output interconnect 28 is preferably designed to cope with output signals, so as to extract the electrical signals output from the sensing electrodes $22_1$ through $22_n$ to the outside.

Figure 3:
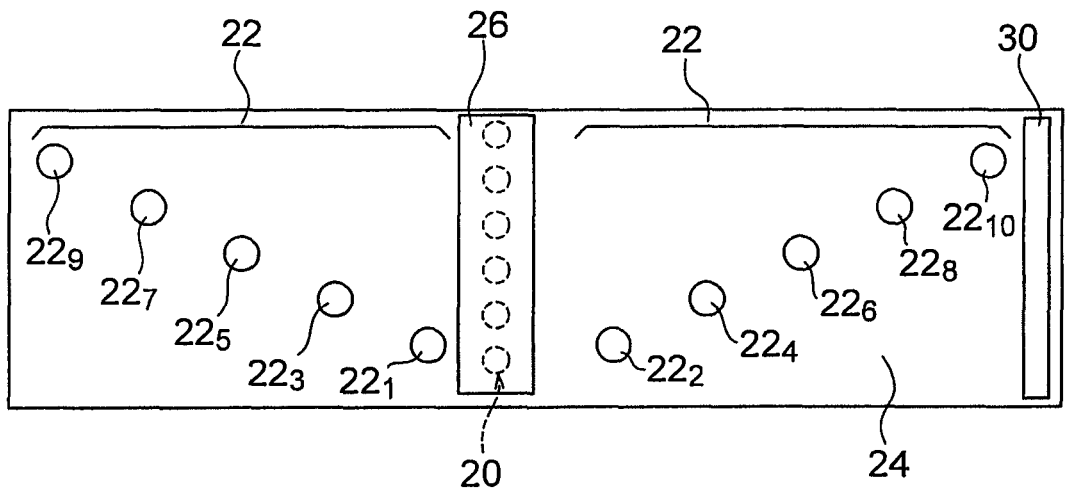
FIG. 3 is a top view of a spin wave device according to a first modification of the first embodiment.

In this embodiment, sensing electrodes are located in the region only on one side of the input interconnect 26. However, to facilitate external connections or restrain influence of electromagnetic induction, sensing electrodes $22_1$ through $22_{10}$ can be arranged on both sides of the input interconnect 26, as in the first modification illustrated in FIG. 3. Specifically, the sensing electrodes $22_1$, $22_3$, $22_5$, $22_7$, and $22_9$ can be located on the left side of the input interconnect 26, and the sensing electrodes $22_2$, $22_4$, $22_6$, $22_8$, and $22_{10}$ can be located on the right side of the input interconnect 26. It should be noted that, for ease of explanation, the number of sensing electrodes shown in FIG. 3 is ten, but the number is not limited to that. In FIG. 3, the odd-numbered sensing electrodes are located on the left side of the input interconnect 26, and the even-numbered sensing electrodes are located on the right side of the input interconnect 26. However, both odd-numbered and even-numbered sensing electrodes can be located on either side of the input interconnect 26.

Meanwhile, electricity is conducted from the input electrode set 20 to the GND electrode 30. Specifically, voltage or current is applied in a direction substantially perpendicular to the contact face of each input electrode $20_i$ (i=1, ..., m). Spin waves are excited in the region of the magnetic layer 18 located below the contact face of each input electrode $20_i$ (i=1, ..., m) by the spin transfer torque caused by the applied voltage or current, and the spin waves propagate through the magnetic layer 18. The electrical signals in accordance with the spin waves propagating through the magnetic layer 18 are extracted from the sensing electrodes $22_1$ through $22_n$. However, in a case where the maximum diameter of the dot-like contact faces of each input electrode $20_i$ (i=1, ..., m) and each sensing electrode $20_j$ (j=1, ..., n) exceeds 500 nm, the magnetization structure of a complicated multidomain is excited by each input electrode $20_i$ (i=1, ..., m) and each sensing electrode $22_j$ (j=1, ..., n). As a result, spin wave control becomes difficult, which is not preferable. Here, the "maximum diameter" means the long axis in cases where the dot-like shapes are elliptical shapes, and the maximum length of diagonal lines in cases where the dot-like shapes are tetragonal or polygonal shapes.

To extract the electrical signals in accordance with the spin waves propagating through the magnetic layer 18, the multilayer stacked film 13 can contain magnetic layers. For example, as in the second modification illustrated in FIG. 4, a stacked structure formed by stacking an antiferromagnetic layer 14, a magnetic layer 15, and a tunnel barrier layer (a spacer layer) 16 can be provided between the foundation layer 12 and the magnetic layer 18. The magnetization direction of the magnetic layer 15 is pinned in one direction by the exchange bias effect of the antiferromagnetic layer 14.

When a voltage is applied between the input electrode set 20 and the GND electrode 30, spin-polarized electrons are injected from the magnetic layer 15 into the magnetic layer 18, and spin transfer torque is applied to the magnetization of the magnetic layer 18. As a result, spin waves are generated. The generated spin waves propagate through the magnetic layer 18, and reach the region located immediately below the sensing electrode set 22. If constant voltage is applied between the sensing electrode set 22 and the GND electrode 30 by using a constant voltage supply at this point, the resistance of the tunnel junction formed with the magnetic layer 18, the tunnel barrier layer 16, and the magnetic layer 15 located immediately below the sensing electrode set 22 is varied by the precession of the magnetization of the magnetic layer 18 due to the spin waves. As a result, a change in the flowing current is induced. Resistance changes are almost proportional to the amplitude intensities of the spin waves, and accordingly, the intensities of the spin waves can be converted into electrical signals.

Figure 5:
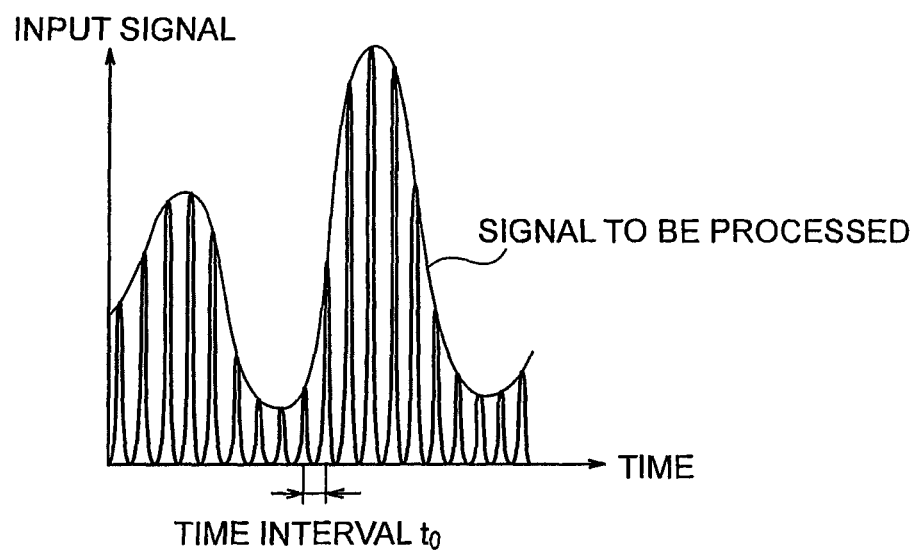
FIG. 5 is a diagram showing an input signal.

In this embodiment, the input signal to be input to each input electrode $20_i$ (i=1, ..., m) via the input interconnect 26 is assumed to be a discrete-time electrical-signal. FIG. 5 shows an example input signal. The input signal is formed with a series of pulses at a time interval $t_0$ or with an impulse signal sequence. In a case where the spin wave device of this embodiment is used as a filter, the envelope of the input signal is the signal to be subjected to processing.

Normally, a response function H(z) of a finite impulse response filter for a discretized input signal is expressed as follows by using a Z-transform:

$$H(z) = \sum_{k=0}^{\infty} h(k) Z^{-k} \quad (1)$$

Here, by suitably selecting a weighting function sequence h(k) (k=0, 1, ...), a passive filter with any frequency response can be realized. $Z^{-1}$ indicates a delay representing the time interval $t_0$ of the impulse signal sequence, and delayed signals are weighted and added, to obtain an output signal. In the above equation (1), an infinite number of impulse signal sequences are added. In an actual system, however, a filter is formed with a finite number (N+1(N≥1), for example) of impulse signal sequences.

Figure 6:
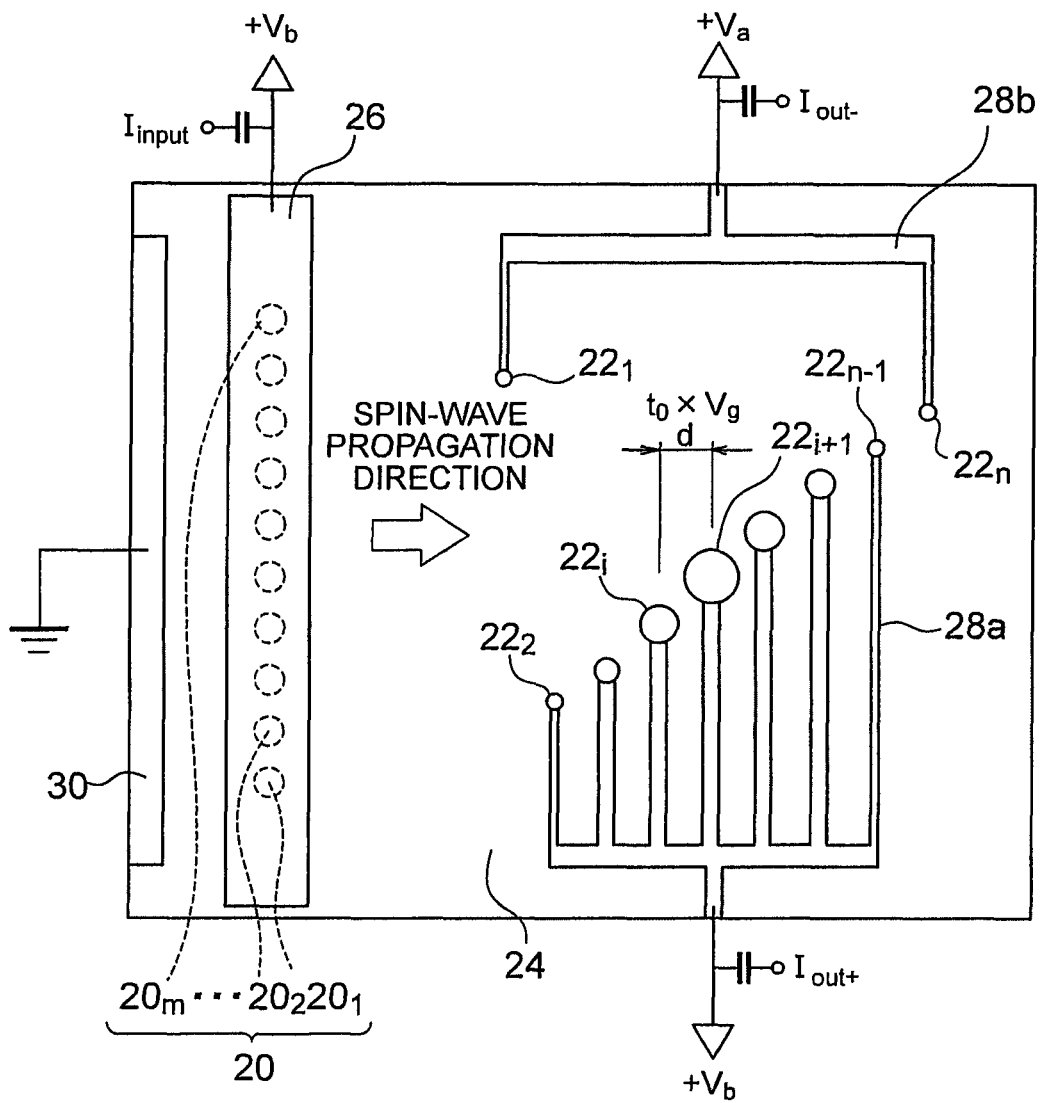
FIG. 6 is a plan view showing a specific example case where the spin wave device of the first embodiment is applied to a finite impulse response filter.

FIG. 6 shows an example in which the spin wave device 1 of this embodiment is applied to a finite impulse response filter. In the finite impulse response filter of this example, an input signal $I_{input}$ is input to the input interconnect 26 via a capacitor, and the input signal $I_{input}$ is sent to the magnetic layer 18 via the input electrodes $20_1$ through $20_m$, to induce spin waves. The induced spin waves propagate through the magnetic layer 18, and output signals in accordance with the spin waves are extracted from the sensing electrodes $22_1$ through $22_n$. An output interconnect 28a is connected to the sensing electrodes $22_2$ through $22_{n-1}$, and a positive output signal $I_{out+}$ is extracted from the output interconnect 28a via a capacitor. An output interconnect 28b is provided to face the output interconnect 28a, and a negative output signal $I_{out-}$ is extracted from the output interconnect 28b via a capacitor. In FIG. 6, the sensing electrodes $22_1$ and $22_n$ are connected to the output interconnect 28b.

The finite impulse response filter of this example has a sufficient number of input electrodes $20_1$ through $20_m$ so that generated spin waves are regarded as plane waves propagating in a direction perpendicular to the extending direction of the input interconnect 26. The distance (the center-to-center distance between sensing electrodes in the direction perpendicular to the input interconnect 26) d between adjacent sensing electrodes $22_i$ and $22_{i+1}$ (I=1, ..., n−1) in the spin-wave propagation direction is preferably equal to the product of the input signal time interval $t_0$ and the group velocity Vg of the spin waves.

When an external field such as a magnetic field, an electrical field, or light is applied to the magnetic layer 18 to modulate the magnetic properties of the magnetic layer 18, the group velocity is also varied. Where Vg' represents the group velocity after the modulation, the finite impulse response filter of this example can be made to function as a filter with different characteristics from the original frequency characteristics with respect to signals at a time interval $t_0'$ (=d/Vg'). The closest sensing electrode to the set 20 of the input electrodes $20_1$ through $20_m$ is the sensing electrode $22_1$, and the farthest sensing electrode from the set 20 is the sensing electrode $22_n$. The sensing electrodes in between are sensing electrodes $22_i$ (i=2, ..., n−1) numbered from the one closest to the input electrode set 20, and the area thereof is expressed as $A_i = A_0 \times h(i)$. Here, $A_0$ represents the area of the sensing electrode to be the reference, and is preferably set so that resistance changes in the sensing electrodes can be regarded proportional to changes in output current.

The impulse signal input through the input interconnect 26 induces spin waves in the magnetic layer 18 located immediately below the input electrodes $20_1$ through $20_m$. The generated spin waves turn into an impulse-like wave packet and propagate to the sensing electrodes $22_1$ through $22_n$. In this manner, the input electrical impulse signal sequences are converted into spin-wave impulse signal sequences. A constant voltage bias $V_b$ is applied to the sensing electrodes $22_1$ through $22_n$ via the output interconnect 28a. When the spin-wave impulse X(T) generated by the input electrodes $20_1$ through $20_m$ at time T reach the sensing electrode $22_1$, a current change $\Delta I_i$ in the current flowing in each sensing electrode $22_i$ (i=1, ..., n), in accordance with the spin waves, is induced. The current change $\Delta I_i$ is expressed by the following equation (2):

$$\Delta I_i = \frac{h(k)}{R_0}\left(1 - \frac{\Delta R}{R_0}\right) V_b \quad (2)$$

Here, h(k) (k=0, 1, ...) represents the weighting function sequence h(k) (k=0, 1, ...) expressed by the equation (1), $R_0$ represents the resistance of the tunnel junction formed with the magnetic layer 18, the tunnel barrier layer 16, and the magnetic layer 15 when the junction area is $A_0$, and $\Delta R$ represents the resistance change in the tunnel junction in accordance with the spin waves. The current change $\Delta I_i$ is proportional to the spin-wave impulse X(T−n×$t_0$). The sensing electrode corresponding to the positive weighting function h is connected to $I_{out+}$, and the electrode corresponding to the negative weighting function h is connected to the terminal of $I_{out-}$. Those two output signals are connected to an external differential amplifier circuit (not shown), and the difference (=$I_{out+} - I_{out-}$) is output.

Figure 4:
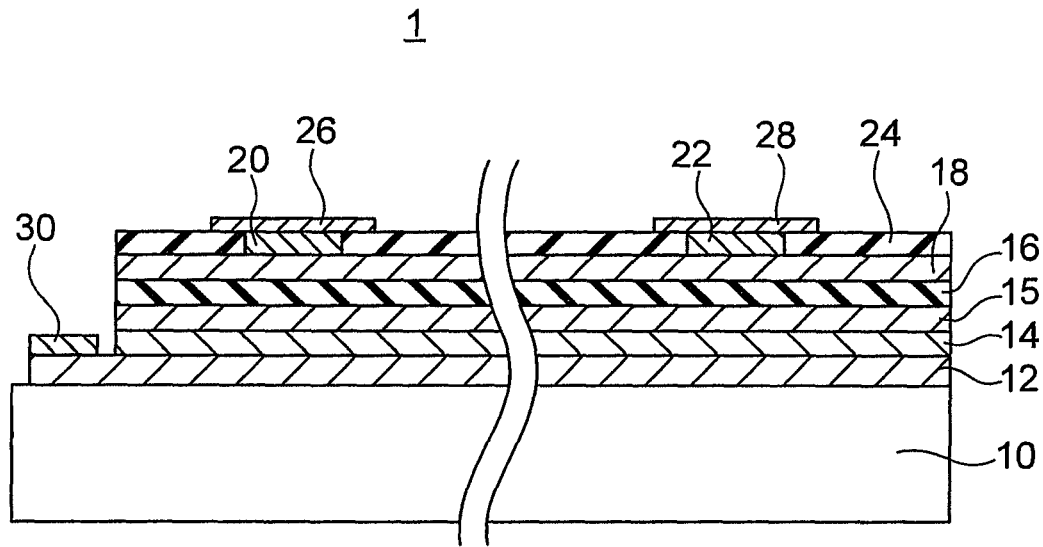
FIG. 4 is a cross-sectional view of a spin wave device according to a second modification of the first embodiment.
Figure 7:
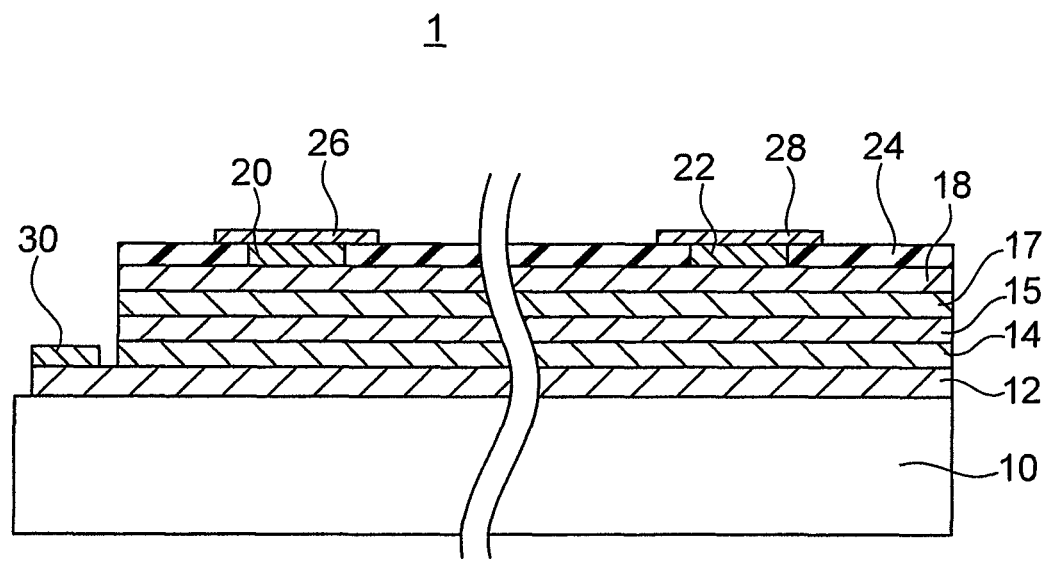
FIG. 7 is a cross-sectional view of the spin wave device according to a third modification of the first embodiment.

With the consistency with the electrical properties of peripheral circuits being taken into consideration, the tunnel barrier layer 16 in the spin wave device of the second modification illustrated in FIG. 4 is replaced with a nonmagnetic conductive layer (a spacer layer) 17 as shown in FIG. 7. With this spin wave device of a third modification, the same effects as those of this embodiment can also be achieved.

As in the second modification using the tunnel barrier layer 16, spin-wave impulse signals can be generated by applying an electrical impulse signal between the input electrodes and the GND electrode. As for the output, by forming the structure illustrated with reference to FIG. 6, spin waves can be sensed via a giant magnetoresistive (GMR) effect, and a desired signal can be output.

In this embodiment or a modification thereof, generation of spin waves is achieved by flowing spin-polarized current to the magnetic layer 18. Specifically, in this embodiment or a modification thereof, it is essential that the tunnel barrier layer 16 or the nonmagnetic conductive layer 17 is provided between the magnetic layer 15 flowing the spin-polarized current and the magnetic layer 18, and the spin-polarized current is introduced into the magnetic layer 18 while direct magnetic coupling between the magnetic layer 15 and the magnetic layer 18 is prevented. Accordingly, as in a spin wave device of a fourth modification illustrated in FIG. 8, the magnetic layer 18 can be provided on the foundation layer 12, and a multilayer stacked film 13A formed by stacking the tunnel barrier layer 16, the magnetic layer 15, and the antiferromagnetic layer 14 in this order can be placed on the magnetic layer 18. This multilayer stacked film 13A also functions as the input electrodes $20_1$ through $20_m$ shown in FIG. 1, and the stacking order is the reverse of the stacking order in the multilayer stacked film 13 of the second modification illustrated in FIG. 4. The side faces of the multilayer stacked film 13A are surrounded by the insulating layer 24, and the upper face of the antiferromagnetic layer 14 is connected to the input interconnect 26. In the fourth modification, the sensing electrodes are connected to the upper face of the magnetic layer 18.

Figure 8:
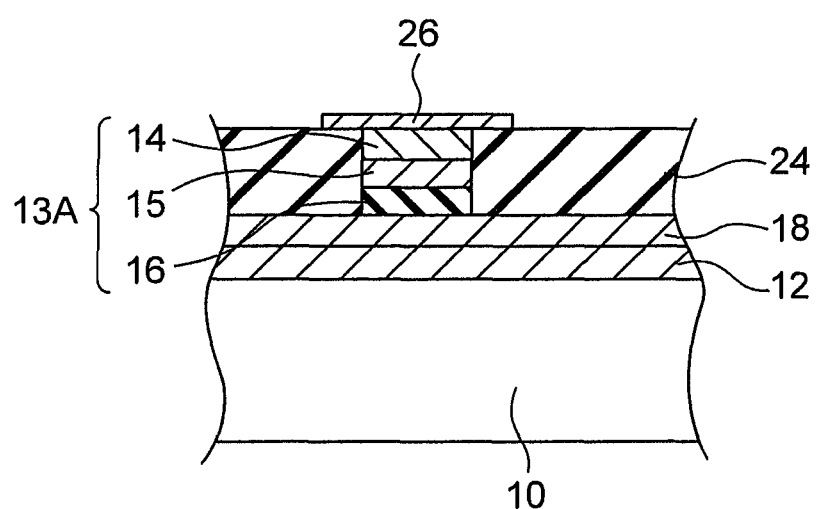
FIG. 8 is a cross-sectional view of the spin wave device according to a fourth modification of the first embodiment.
Figure 9:
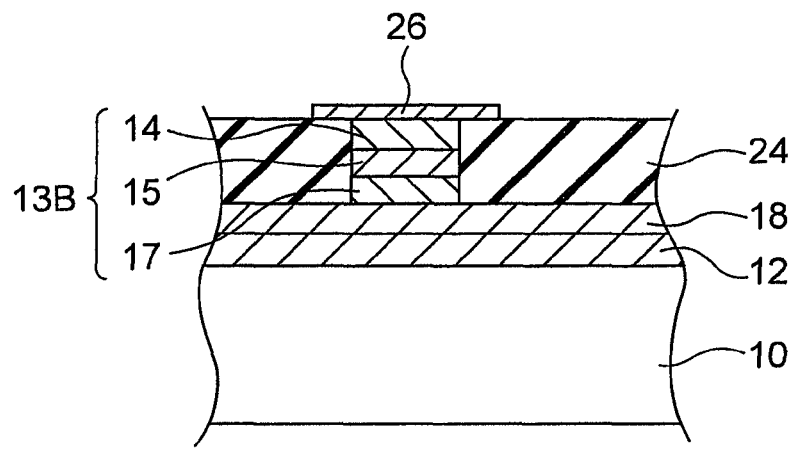
FIG. 9 is a cross-sectional view of the spin wave device according to a fifth modification of the first embodiment.

Alternatively, a spin wave device of a fifth modification illustrated in FIG. 9 can be provided. The spin wave device of the fifth modification is the same as that of the fourth modification illustrated in FIG. 8, except that the multilayer stacked film 13A is replaced with a multilayer stacked film 13B having the nonmagnetic conductive layer 17 in place of the tunnel barrier layer 16. In the fifth modification, the sensing electrodes are also connected to the upper face of the magnetic layer 18.

In the fourth and fifth modifications illustrated in FIGS. 8 and 9, only a thin film being stuck to the substrate 10 and realizing a high-quality thin film, and the foundation layer 12 including a multilayer film consisting of thin films with excellent electrical conductivity are provided between the magnetic layer 18 and the substrate 10 on the input electrode side. On the sensing electrode side, on the other hand, to sense spin waves via a tunnel magnetoresistive effect or a giant magnetoresistive effect, the tunnel barrier layer 16 or the nonmagnetic conductive layer 17 formed under the magnetic layer 18, and a stacked structure having the magnetic layer 15 formed under the tunnel barrier layer or the nonmagnetic conductive layer 17 and an antiferromagnetic layer formed under the magnetic layer 15 can be provided between the magnetic layer 18 and the foundation layer 12, as shown in FIG. 4 or 7. That is, on the sensing electrode side, the foundation layer 12, the antiferromagnetic layer 14, the magnetic layer 15, the tunnel barrier layer 16 or the nonmagnetic conductive layer 17, and the magnetic layer 18 are stacked in this order. Accordingly, the sensing electrodes are connected to the upper face of the magnetic layer 18 in this case.

In the first embodiment, spin waves are sensed by the sensing electrodes utilizing a tunnel magnetoresistive effect or a giant magnetoresistive effect. While direct magnetic coupling between the magnetic layer 18 and the magnetic layer 15 is prevented by providing the tunnel barrier layer 16 or the nonmagnetic conductive layer 17 in between, changes in the magnetization direction of the magnetic layer 18 with respect to the magnetization of the magnetic layer 15 are converted into current changes via a tunnel magnetoresistive effect or a giant magnetoresistive effect. In this manner, spin wave detection is realized. Therefore, as in a sixth modification illustrated in FIG. 10, each sensing electrode can have a multilayer stacked film including the tunnel barrier layer 16 formed on the magnetic layer 18, the magnetic layer 15 formed on the tunnel barrier layer 16, and the antiferromagnetic layer 14 that is formed on the magnetic layer 15 and pins the magnetization direction of the magnetic layer 15 in one direction. Alternatively, as in a seventh modification illustrated in FIG. 11, each sensing electrode can have a multilayer stacked film in which the tunnel barrier layer 16 is replaced with the nonmagnetic conductive layer 17. In those cases, to generate spin waves on the input electrode side, a stacked structure including the tunnel barrier layer 16 or the nonmagnetic conductive layer 17 formed under the magnetic layer 18, the magnetic layer 15 formed under the tunnel barrier layer 16 or the nonmagnetic conductive layer 17, and the ferromagnetic layer 14 formed under the magnetic layer 15 can be provided between the magnetic layer 18 and the foundation layer 12, as shown in FIG. 4 or 7. That is, on the sensing electrode side, the foundation layer 12, the antiferromagnetic layer 14, the magnetic layer 15, the tunnel barrier layer 16 or the nonmagnetic conductive layer 17, and the magnetic layer 18 are stacked in this order. Accordingly, the input electrodes are connected to the upper face of the magnetic layer 18 in this case.

Figure 10:
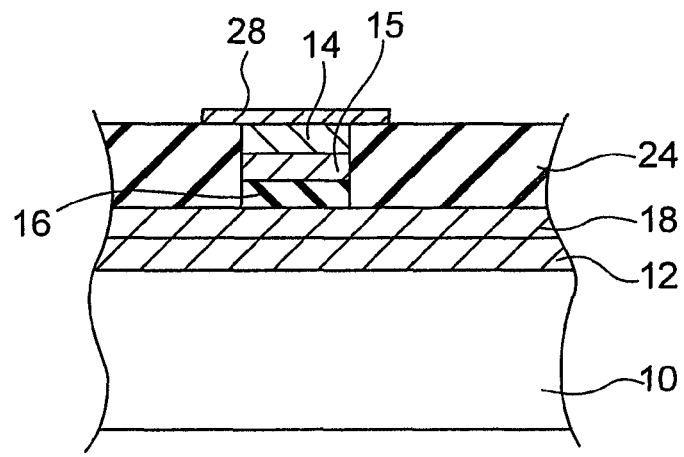
FIG. 10 is a cross-sectional view of the spin wave device according to a sixth modification of the first embodiment.
Figure 11:
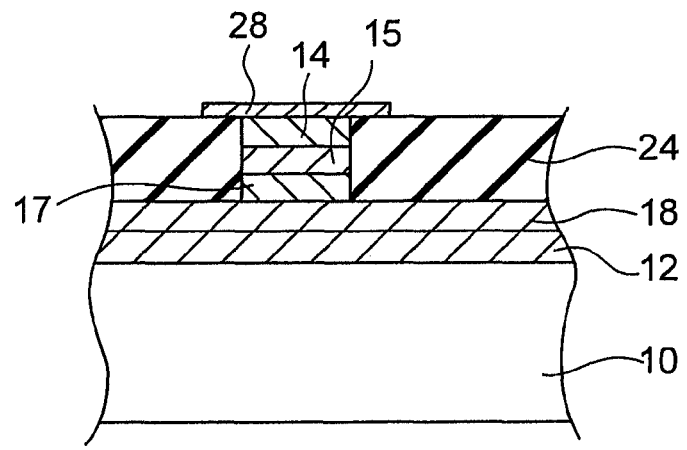
FIG. 11 is a cross-sectional view of the spin wave device according to a seventh modification of the first embodiment.

Alternatively, each input electrode can be designed to have the structure illustrated in FIG. 8, and each sensing electrode can be designed to have the structure illustrated in FIG. 10. Also, each input electrode can be designed to have the structure illustrated in FIG. 9, and each sensing electrode can be designed to have the structure illustrated in FIG. 11.

In this embodiment and the modifications thereof, the magnetic layer 18 and the magnetic layer 15 are provided. The magnetization directions (the easy axes of magnetization) of the magnetic layer 18 and the magnetic layer 15 are substantially parallel or perpendicular to the film plane when an external magnetic field is not applied. Here, the "film plane" means the upper face of the magnetic layer 18 or the magnetic layer 15.

The magnetic material that has a magnetization direction substantially perpendicular to the film plane and is used for the magnetic layer 18 or the magnetic layer 15 can be FeVPd, FeCrPd, CoFePt, or the like. Specifically, the magnetic material can be an alloy containing at least one element selected from the group consisting of iron (Fe), cobalt (Co), nickel (Ni), manganese (Mn), and chromium (Cr), and at least one element selected from the group consisting of platinum (Pt), palladium (Pd), iridium (Ir), ruthenium (Ru), and rhodium (Rh). The characteristics of such alloys can be controlled by adjusting the composition of the magnetic material or performing a heat treatment. Alternatively, it is preferable to use an amorphous alloy of a rare earth such as TbFeCo or GdFeCo and a transition metal, or a stacked structure such as Co/Pt, Co/Pd, or Co/Ni.

Also, the magnetic material having an easy axis of magnetization (a magnetization direction) substantially perpendicular to the film plane can be a magnetic metal containing at least one element selected from the group consisting of iron (Fe), cobalt (Co), nickel (Ni), manganese (Mn), and chromium (Cr), for example.

Figure 12:
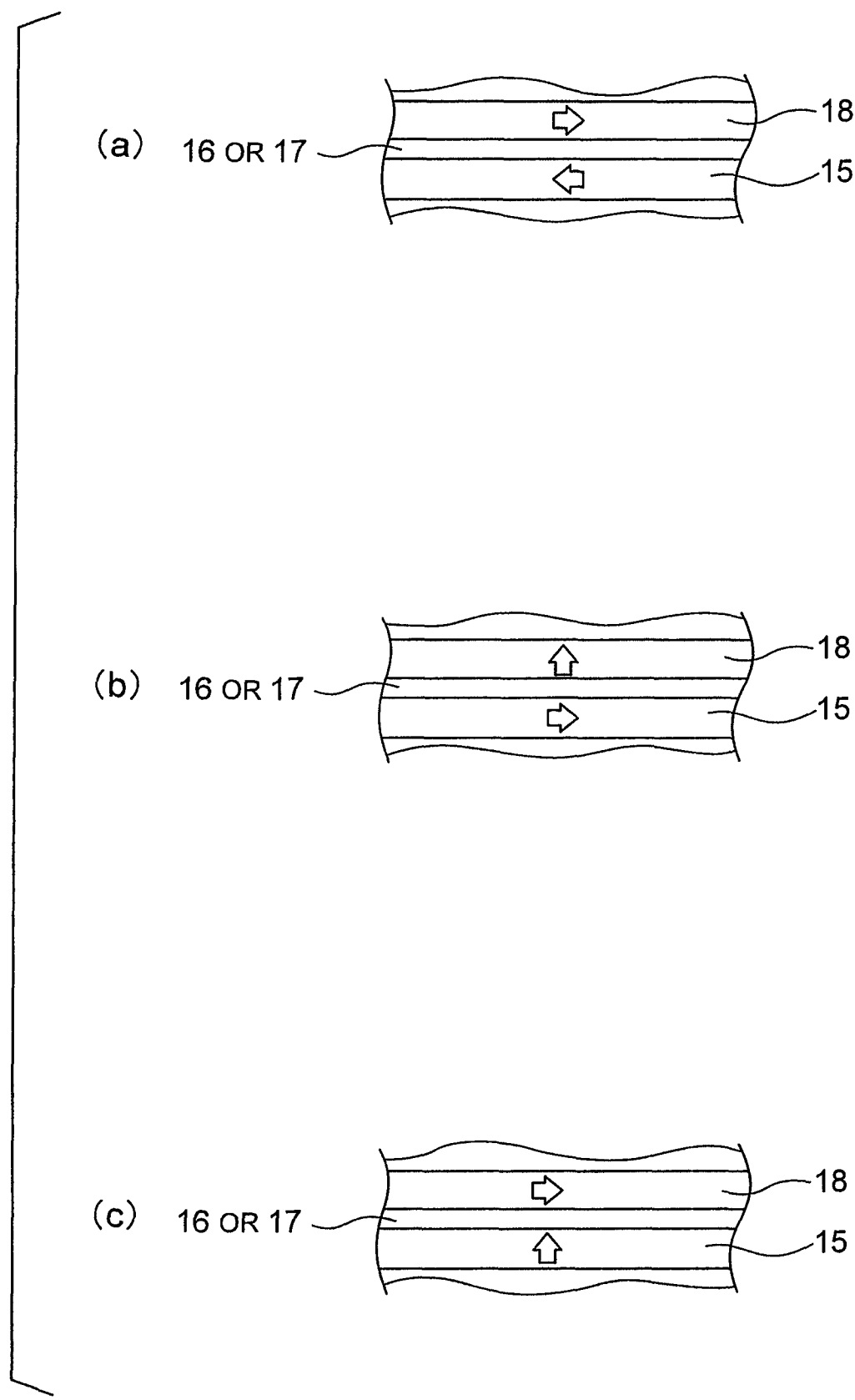
FIGS. 12(a) through 12(c) are cross-sectional views showing magnetization directions of a magnetic layer 18 and a magnetic layer 15.

The magnetization directions of the magnetic layer 18 and the magnetic layer 15 can be parallel to the film plane and antiparallel to (the opposite from) each other, as shown in FIG. 12(a). Alternatively, the magnetization direction of the magnetic layer 18 can be perpendicular to the film: plane, as shown in FIG. 12(b). In those cases, the spin-wave propagation characteristics do not have in-plane propagation-direction dependence, and accordingly, the degree of freedom in electrode arrangement or the like is increased. If the magnetic layer 15 having a magnetization perpendicular to the magnetization layer 18 having an in-plane magnetization is used as shown in FIG. 12(c), the rate of rise at the time of spin wave induction with current becomes dramatically higher. This is advantageous to high-speed processing.

In cases where the above-described magnetic materials are used for the magnetic layers, the frequency of the high-frequency magnetic field generated from the magnetic layers can be tuned by adjusting magnetic anisotropies and saturation magnetizations. Also, the attenuation rate of spin waves can be lowered by reducing the state density of the Fermi surface to that of a half metal.

The material of the tunnel barrier layer 16 can be an oxide, a nitride, a fluoride, an oxynitride containing at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe). Alternatively, it is preferable to use a semiconductor having a wide energy gap, such as AlAs, GaN, AlN, ZnSe, or ZnO. The thickness of the tunnel barrier layer 16 is preferably in the range of approximately 0.2 nm to 2.0 nm, so as to obtain large output signals.

The specific material of the nonmagnetic conductive layer 17 can be copper (Cu), gold (Au), silver (Ag), aluminum (Al), or an alloy containing at least one element selected from the group consisting of copper (Cu), gold (Au), silver (Ag), and aluminum (Al). The layer thickness in this case is not smaller than 1.5 nm and not greater than 20 nm. Such a layer thickness has advantages that interlayer coupling is not formed between the magnetic layer 18 and the magnetic layer 15, and that the spin-polarized states of conduction electrons are not lost when the conduction electrons pass through the nonmagnetic conductive layer 17.

As described above, this embodiment can realize a high-speed operation element that exhibits finite impulse responses by generating spin-wave impulse signals in the magnetic layer 18 from impulse input electrical signals, converting the signals that have propagated through the magnetic layer 18 and have been input to the sensing electrodes 22 at different times, have been converted into electrical signals again, and adding up the electrical signals. Accordingly, a spin wave device that can be integrated into a LSI circuit and has a high degree of freedom in setting frequency characteristics can be realized.

Second Embodiment

Figure 13:
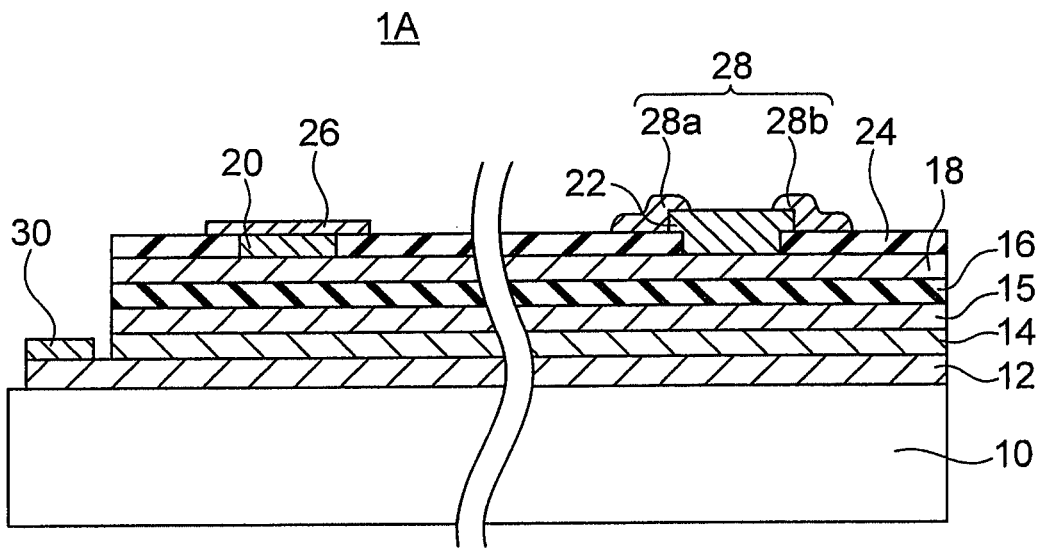
FIG. 13 is a cross-sectional view of the spin wave device according to a second embodiment.

FIG. 13 shows a spin wave device according to a second embodiment of the present invention. The spin wave device 1A of this embodiment is the same as the spin wave device 1 of the first embodiment illustrated in FIG. 2, except that the output interconnect 28 is replaced with two output interconnects 28a and 28b so as to sandwich the sensing electrodes 22. In the first embodiment, spin wave detection with the sensing electrodes 22 is performed by using a tunnel magnetoresistive effect or a giant magnetoresistive effect. In the second embodiment, on the other hand, the two output interconnects 28a and 28b are arranged to sandwich the sensing electrodes 22 connected to the magnetic layer 18 as shown in FIG. 13, and the electromotive force generated by the spin Hall effect that occurs between the two output interconnects 28a and 28b is regarded as the output.

When magnetization precession movement is caused by spin waves in the magnetic layer 18 located immediately below the sensing electrodes 22, a spatial distribution is formed in the spin polarization of the conduction electrons in the sensing electrodes 22 by a phenomenon called "spin pumping." The spin polarization is highest in the portions of the sensing electrodes 22 being adjacent to the magnetic layer 18, and the spin polarization becomes lower toward the faces of the sensing electrodes 22 on the opposite side from the magnetic layer 18. The spatial distribution of spin polarization also induces a spatial distribution of charges in the sensing electrodes 22. Therefore, by detecting the special distribution of charges, spin wave signals can be converted into electrical signals.

Figure 14:
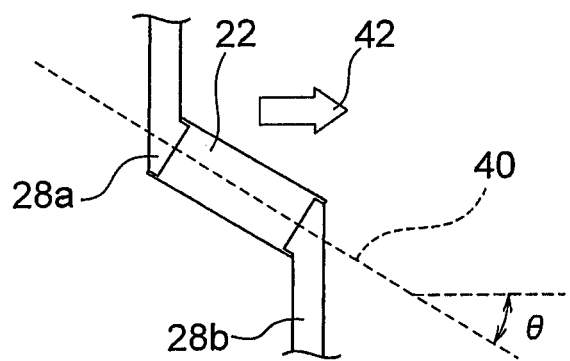
FIG. 14 is a diagram for explaining a signal weighting method according to the second embodiment.

FIG. 14 is an enlarged top view of one of the sensing electrodes 22 and the output interconnects 28a and 28b connected to the one sensing electrode 22. The magnitude of the electromotive force $V_{out}$ generated between the two output interconnects 28a and 28b depends on an angle θ and an amplitude intensity A. The angle θ is the angle of the straight line 40 connecting the center points of the two connecting portions between the sensing electrode 22 and the output interconnects 28a and 28b, with respect to the magnetization direction 42 of the magnetic layer 18. The amplitude intensity A is the amplitude intensity of spin waves propagating through the magnetic layer 18 immediately below the sensing electrode 22. That is, the electromotive force $V_{out}$ is proportional to A sine. By utilizing this relationship, the factor of the conversion of the spin wave signal of each of the sensing electrodes 22 with respect to spin waves of the same intensity into electrical signals can be varied with the angle θ, and weighting can be realized. In the following, the conversion factor for the ith sensing electrode 22 is represented by $w_i$.

Figure 15:
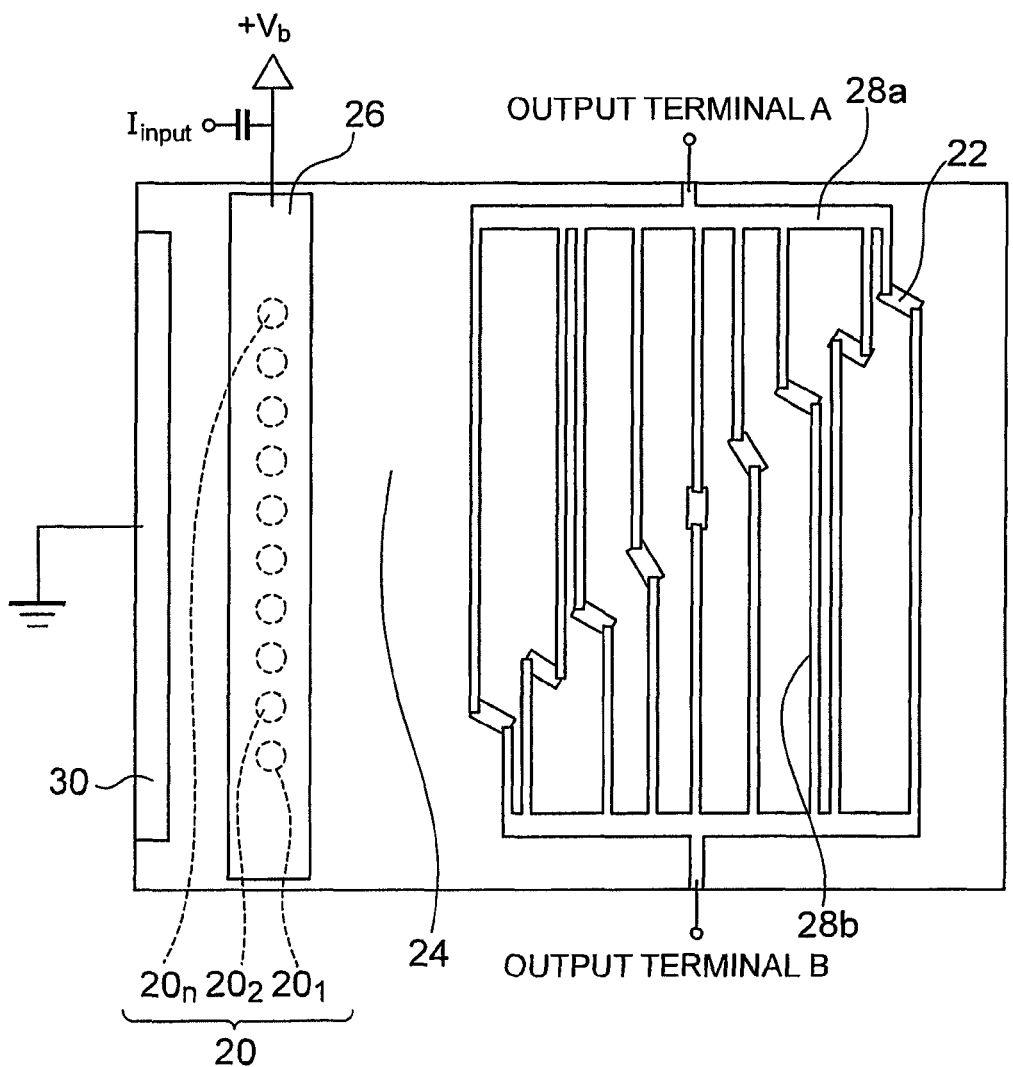
FIG. 15 is a plan view showing a specific example case where the spin wave device of the second embodiment is applied to a finite impulse response filter.

FIG. 15 shows an example case where the spin wave device 1A of the second embodiment is applied to a finite impulse response filter. As in the case illustrated in FIG. 6, the distance between sensing electrodes in the spin-wave propagation direction (the center-to-center distance between sensing electrodes) is preferably equal to the product of the input signal time interval $t_0$ and the group velocity Vg of spin waves. When the magnetic properties are modulated by applying an external field such as a magnetic field, an electric field, or light to the magnetic layer 18, the group velocity is also varied. Where Vg' represents the group velocity after the modulation, the finite impulse response filter of this example can be made to function as a filter with different characteristics from the original frequency characteristics with respect to signals at a time interval $t_0'=d/Vg'$.

The portion to generate spin waves is the same as that of the first embodiment, and can have a structure in which the tunnel barrier layer 16 or the nonmagnetic conductive layer 17 adjacent to the magnetic layer 18 is provided between the magnetic layer 18 and the foundation layer 12, the magnetic layer 15 is adjacent to the tunnel barrier layer 16 or the nonmagnetic conductive layer 17, and the antiferromagnetic layer 14 is adjacent to the magnetic layer 15 as shown in FIG. 13, or can have a structure in which each of the input electrodes 20 is a multilayer stacked film as shown in FIGS. 8 and 9. After a delay time corresponding to the distance, spin-wave impulse signals generated by the same method as that of the first embodiment reach the positions of the respective sensing electrodes 22, and are converted into electrical signals in accordance with the conversion factor w. The two output interconnects 28a and 28b connected to the respective sensing electrode 22 are connected to output terminals A and B, respectively, and the signals generated from all the sensing electrodes 22 are electrically added up and are output to the outside. Negative weighting can be realized by switching the connecting positions of the output interconnects 28a and 28b connected to the respective output terminals A and B. To achieve large signals with high precision, the resistance of each of the sensing electrodes 22 is preferably much higher than the input impedance of a later-stage circuit connected to the output terminals A and B.

Figure 16:
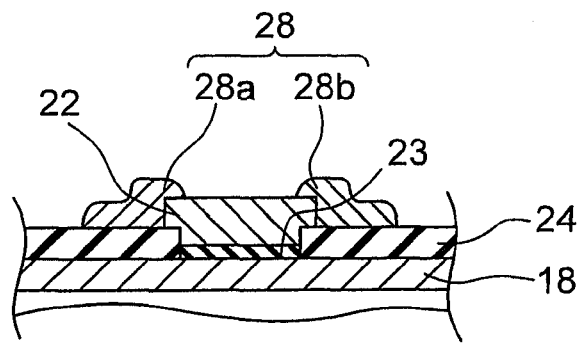
FIG. 16 is a cross-sectional view showing the output unit of a spin wave device according to a modification of the second embodiment.

In a case where noise generation due to the ground loop is to be restrained in view of the structures of peripheral circuits connected to the spin wave device of this embodiment, a tunnel barrier layer 23 can be inserted between the sensing electrodes 22 and the magnetic layer 18, as shown in FIG. 16. In this case, by restricting the thickness of the tunnel barrier layer 23 within the range of approximately 0.2 nm to 2.0 nm, influences of the ground loop can be minimized while the spin pumping effect is maintained.

Although the sensing electrodes 22 have rectangular shapes in FIGS. 14 and 15, the in-planar shapes of the sensing electrodes 22 preferably have two-fold rotational symmetry or high-order rotational symmetry like circles, from the viewpoint of easy weighting of the electromotive force generated by the spin Hall effect.

As described above, this embodiment can realize a high-speed operation element that exhibits finite impulse responses by generating spin-wave impulse signals in the magnetic layer 18 from impulse input electrical signals, converting the signals that have propagated through the magnetic layer 18 and have been input to the sensing electrodes 22 at different times and have been converted into electrical signals, and adding up the electrical signals. Accordingly, a spin wave device that can be integrated into a LSI circuit and has a high degree of freedom in setting frequency characteristics can be realized.

Example 1

Referring now to FIGS. 4 and 6, Example 1 of an embodiment is described. This example concerns a finite-impulse-response low-frequency-range transmission filter that has nine taps (N=9), and includes ten input electrodes $20_1$ through $20_{10}$ that penetrate through the insulating layer 24 and are adjacent to the magnetic layer 18, and nine sensing electrodes $22_1$ through $22_9$ that also penetrate through the insulating layer 24 and reach the magnetic layer 18, as shown in FIGS. 4 and 6. The diameter of each of the input electrodes $20_1$ through $20_{10}$ is 50 nm. In designing the structure, the target characteristics included a cutoff frequency $f_c$ of 1 GHz with respect to an envelope signal formed with an impulse train at a sampling frequency $f_s$ of 3.3 GHz. Here, the sensing electrodes $22_1$ through $22_9$ are numbered from the input electrode side. The sensing electrode $22_5$ in the middle is the reference sensing electrode, and the diameter of the reference sensing electrode is 100 nm. The area $A_n$ of each of the other sensing electrodes $22_n$ (n=1, 2, 3, 4, 6, 7, 8, 9) is set by the following equation, with the area $A_5$ of the sensing electrode $22_5$ being the reference:

$$A_n = A_5 \times \frac{\pi}{\omega_c T} \times \frac{\sin[(n-5)\omega_c T]}{(n-5)\pi} \quad (3)$$

Here, the cutoff angular frequency $\omega_c$ is $2\pi f_c$, and the sampling period T is $1/f_s$. In a case where the above value is positive, it is connected to a sensing electrode shown in a lower portion of FIG. 6. In a case where the above value is negative, it is connected to the output interconnect in the upper half of FIG. 6. The distance between each two sensing electrodes was 300 nm, with the group velocity of spin waves being 1 μm/nsec, and the sampling period T being 300 Ps.

The finite-impulse-response low-frequency-range transmission filter of this example has the stacked structure illustrated in FIG. 4. In this example, a CoFeB layer was used as the magnetic layer 18, a MgO layer was used as the tunnel barrier layer 16, and a CoFe/CoFeB double-layer stacked structure was used as the magnetic layer 15. The magnetization of the magnetic layer 15 is pinned in a direction from the left side to the right side in FIG. 4 by the antiferromagnetic layer 14 made of IrMn. Meanwhile, the magnetization of the magnetic layer 18 is antiparallel to the magnetization of the magnetic layer 15 in a case where no external magnetic fields exist.

The finite impulse response filter of this example is manufactured as follows. First, the foundation layer 12 is formed on the wafer (substrate) 10, and the wafer 10 is then placed in an ultrahigh vacuum sputtering apparatus. The antiferromagnetic layer 14 made of IrMn, the magnetic layer 15 having a CoFe/CoFeB stacked structure, the tunnel barrier layer 16 made of MgO, the magnetic layer 18 made of CoFeB, and a cap layer (not shown) made of Ru are stacked in this order on the foundation layer 12. The magnetization of the magnetic layer 15 having a CoFe/CoFeB stacked structure is then pinned by annealing in a magnetic field. Also, a magnetic field is applied at room temperature, to pin the magnetization of the magnetic layer 18 made of CoFeB in the direction antiparallel to the magnetization direction of the magnetic layer 15 having a CoFe/CoFeB stacked structure.

A resist is then applied onto the entire surface, and patterning is performed on the resist with an exposure apparatus using a KrF light source, to form an opening in the portion corresponding to the GND electrode 30 in the resist. By using an ion milling technique and using the resist with the opening as a mask, the antiferromagnetic layer 14, the magnetic layer 15, the tunnel barrier layer 16, the magnetic layer 18, and the cap layer (not shown) made of Ru are scraped off from the region on which the GND electrode 30 is to be formed. As a result, the upper face of the foundation layer 12 is exposed.

An EB (electron beam) resist is then applied onto the cap layer, and EB exposure is performed, to form openings corresponding to the GND electrode 30, the input electrodes $20_1$ through $20_{10}$, and the sensing electrodes $22_1$ through $22_9$ in the EB resist. The openings corresponding to the GND electrode 30, the input electrodes $20_1$ through $20_{10}$, and the sensing electrodes $22_1$ through $22_9$ are filled with Cu. The EB resist is then removed, to form the GND electrode 30, the input electrodes $20_1$ through $20_{10}$, and the sensing electrodes $22_1$ through $22_9$.

The SiO$_2$ layer 24 is then formed so as to completely cover the multilayer film structure formed with the antiferromagnetic layer 14, the magnetic layer 15, the tunnel barrier layer 16, and the magnetic layer 18, the GND electrode 30, the input electrodes $20_1$ through $20_{10}$, and the sensing electrodes $22_1$ through $22_9$. After that, the surface of the SiO$_2$ layer 24 is flattened by ion milling, to expose the upper faces of the GND electrode 30, the input electrodes $20_1$ through $20_{10}$, and the sensing electrodes $22_1$ through $22_9$.

The input interconnect 26 and the output interconnect 28 to be connected to the input electrodes $20_1$ through $20_{10}$ and the sensing electrodes $22_1$ through $22_9$ are then formed. To form the input interconnect 26 and the output interconnect 28, a resist is applied onto the entire surface, and patterning is performed on the resist with an exposure apparatus with a KrF light-source, to form openings connecting to the input electrodes $20_1$ through $20_{10}$ and the sensing electrodes $22_1$ through $22_9$ in the resist. The openings are filled with Cu. The resist is then removed, to form the input interconnect 26 and the output interconnect 28. It should be noted that a pulse current with a half-value width of 200 ps was flowed to the input electrodes 20 in advance. Signal analysis with a spectrum analyzer connected to the input electrodes 20 and time resolved detection at the signal sensing electrodes 22 at different distances were then performed, to confirm that the center frequency of propagating spin waves was approximately 12.4 GHz, and the group velocity was 0.98 μm/nsec.

Constant bias voltage was then applied to each of the input electrodes $20_1$ through $20_{10}$ and the sensing electrodes $22_1$ through $22_9$. A signal generated by amplitude-modulating an impulse train of impulses having a repetition frequency of 3.3 GHz and a half-value width of 200 ps with a sine wave sin(ωt) was input to the input electrodes 20 through capacitance coupling, and the frequency of the sine wave was swept from 500 MHz to 1.5 GHz. As a result, the same sine-wave modulated impulse signal as an input signal with an amplitude of 10 μA was obtained from the output terminal until the frequency of the sine wave reached 1 GHz, but the amplitude rapidly became smaller after the frequency of the sine wave exceeded 1 GHz. In this manner, it was confirmed that the infinite-impulse-response low-frequency-range transmission filter of this example was operating as planned.

Further, a magnetic field of 200 Oe was applied from the bottom to the top in the drawing in a direction parallel to the magnetization direction of the magnetic layer 18, to set the group velocity of spin waves to 0.75 μm/nsec. The same experiment as above was then conducted, with the impulse train repetition period being 400 ps. As a result, it was confirmed that a cutoff frequency of 750 MHz was obtained, and filter characteristics can be tuned by adjusting the magnetic field to be applied.

Example 2

Next, Example 2 of an embodiment is described. This example concerns a finite-impulse-response low-frequency-range transmission filter in which the input electrodes and the sensing electrodes have multilayer film structures as shown in FIGS. 8 and 10. The sizes, arrangement, and numbers of the input and sensing electrodes are the same as those of Example 1.

The finite-impulse-response low-frequency-range transmission filter of Example 2 is manufactured as follows. First, the foundation layer 12 is formed on the wafer (substrate) 10, and the wafer 10 is then placed in an ultrahigh vacuum sputtering apparatus. The magnetic layer 18 made of CoFeB, the tunnel barrier layer 16 made of MgO, the magnetic layer 15 having a CoFeB/CoFe stacked structure, the antiferromagnetic layer 14 made of IrMn, and a cap layer (not shown) made of Ru are stacked in this order on the foundation layer 12. The magnetization of the magnetic layer 15 having a CoFeB/CoFe stacked structure is then pinned by annealing in a magnetic field. After that, a magnetic field is applied at room temperature, to pin the magnetization of the magnetic layer 18 so that the magnetization directions of the magnetic layer 15 and the magnetic layer 18 made of CoFeB become antiparallel to each other.

A resist is then applied onto the entire surface, and patterning is performed on the resist with an exposure apparatus using a KrF light-source, to form an opening in the position corresponding to the GND electrode 30 in the resist. By using an ion milling technique and using the resist with the opening as a mask, the magnetic layer 18, the tunnel barrier layer 16, the magnetic layer 15, and the cap layer are scraped off the region on which the GND electrode 30 is to be formed. As a result, the upper face of the foundation layer 12 is exposed.

After the resist pattern is removed, an EB resist is again applied onto the entire surface, and EB exposure is performed, to perform patterning so that the resist remains only on the portions corresponding to the GND electrode 30, the input electrodes 20, and the sensing electrodes 30. By using an ion milling technique and using the patterned resist as a mask, the magnetic layer 15, the antiferromagnetic layer 14, and the cap layer are scraped off, until the upper face of the tunnel barrier layer 16 is exposed through the portions at which the resist does not remain.

Further, with the patterned resist being left as it is, the insulating layer 24 made of $SiO_2$ is deposited, with a sputtering apparatus, on the portions through which the upper face of the tunnel barrier layer 16 is exposed. In this manner, the input electrodes 20 and the sensing electrodes 22 that have not been scraped off by the ion milling are embedded in the insulating layer 24. The resist, as well as the $SiO_2$ layer formed on the resist, is then removed.

A resist is again applied onto the entire surface, and a resist pattern having openings at the portions corresponding to the input interconnect 26, the output interconnect 28, and the GND electrode 30 is formed with an exposure apparatus using a KrF light-source. The openings are filled with Cu. The resist is then removed, to form the input interconnect 26, the output interconnect 28, and the GND electrode 30.

The finite-impulse-response low-frequency-range transmission filter manufactured in the above manner exhibited almost the same frequency characteristics as those of the finite-impulse-response low-frequency-range transmission filter of Example 1. When the same signal voltage was applied to the input electrodes 20, a current of only 3 μA was generated in this example. The number of procedures for manufacturing the finite-impulse-response low-frequency-range transmission filter of this example is larger than the number of manufacturing procedures required in Example 1. However, confinement of current can be more efficiently performed in this example. Accordingly, the finite-impulse-response low-frequency-range transmission filter of this example consumes less power.

Example 3

Next, Example 3 of the present invention is described. This example concerns a finite-impulse-response low-frequency-range transmission filter using spin pumping and a spin Hall effect in the spin wave detection by sensing electrodes, as shown in FIGS. 13, 14, and 15. The total number of sensing electrodes 22 is nine, and the sensing electrodes $22_1$ through $22_9$ are numbered from the input electrode side. The sensing electrodes 22 have rectangular shapes as shown in FIGS. 13 and 14. The arrangement is the same as that of Example 1. The weighting of sensed signals is determined by the positional relationship between the magnetization direction of the magnetic layer 18 and the point at which the electromotive force generated in the sensing electrodes 22 is detected, as shown in FIG. 13. The angle θ shown in FIG. 14 is zero in the sensing electrode $22_5$ in the middle, and the angle $θ_n$ of each of the other sensing electrodes $22_n$ (n=1, 2, 3, 4, 6, 7, 8, 9) is expressed as follows:

$$\theta_n = \sin^{-1}\left\{\frac{\pi}{\omega_c T} \times \frac{\sin[(n-5)\omega_c T]}{(n-5)\pi}\right\} \quad (4)$$

The stacked structure, and the magnetization directions of the magnetic layer 18 and the magnetic layer 15 are also the same as those of Example 1.

The finite-impulse-response low-frequency-range filter of Example 3 is manufactured as follows. First, the foundation layer 12 is formed on the wafer (substrate) 10, and the wafer 10 is then placed in an ultrahigh vacuum sputtering apparatus.

The antiferromagnetic layer 14 made of IrMn, the magnetic layer 15 having a CoFe/CoFeB stacked structure, the tunnel barrier layer 16 made of MgO, the magnetic layer 18 made of CoFeB, and a cap layer (not shown) made of Ru are stacked in this order on the foundation layer 12. The magnetization of the magnetic layer 15 having a CoFe/CoFeB stacked structure is then pinned in a direction from the left side to the right side in FIG. 13, for example, by annealing in a magnetic field. Also, a magnetic field is applied at room temperature, to pin the magnetization of the magnetic layer 18 made of CoFeB in the direction antiparallel to the magnetization direction of the magnetic layer 15.

A resist is then applied onto the entire surface, and patterning is performed on the resist with an exposure apparatus using a KrF light-source, to form an opening in the position corresponding to the GND electrode 30 in the resist. By using an ion milling technique and using the resist with the opening as a mask, the antiferromagnetic layer 14, the magnetic layer 15, the tunnel barrier layer 16, the magnetic layer 18, and the cap layer are scraped off the region on which the GND electrode 30 is to be formed. As a result, the upper face of the foundation layer 12 is exposed.

An EB resist is then applied onto the cap layer, and EB exposure is performed, to form openings in the regions in the EB resist in which the GND electrode 30 and the input electrodes 20 are to be formed. The openings corresponding to the regions in which the GND electrode 30 and the input electrodes 20 are to be formed are filled with Cu. The EB resist is then removed, to form the GND electrode 30 and the input electrodes 20.

An EB resist is again applied, and EB exposure is performed, to form openings corresponding to the sensing electrodes 22 in the EB resist. In the openings corresponding to the sensing electrodes 22, embedded films are formed with Pt, which has a great spin orbit interaction. The EB resist is then removed, to form the sensing electrodes 22.

The SiO$_2$ layer 24 is then formed so as to completely cover the multilayer film structure formed with the antiferromagnetic layer 14, the magnetic layer 15, the tunnel barrier layer 16, and the magnetic layer 18, the GND electrode 30, the input electrodes 20, and the sensing electrodes 22. After that, the surface of the SiO$_2$ layer 24 is flattened by using an ion milling technique, to expose the upper faces of the GND electrode 30, the input electrodes 20, and the sensing electrodes 22. The input interconnect 26 and the output interconnect 28 to be connected to the input electrodes 20 and the sensing electrodes 22 are then formed. To form the input interconnect 26 and the output interconnect 28, a resist is applied onto the entire surface, and patterning is performed on the resist with an exposure apparatus using a KrF light-source, to form openings connecting to the input electrodes 20 and the sensing electrodes 22 in the resist. The openings are filled with Cu. The resist is then removed, to form the input interconnect 26 and the output interconnect 28.

The finite-impulse-response low-frequency-range transmission filter manufactured in the above manner exhibited almost the same frequency characteristics as those of the finite-impulse-response low-frequency-range transmission filter of Example 1. The output signal intensity of this example was as small as approximately 20% of the output signal intensity of Example 1. However, there was no need to connect a power source from the outside to the sensing electrodes, and accordingly, a finite-impulse-response low-frequency-range transmission filter with lower power consumption was realized.

As described so far, each of the embodiments and examples of the present invention can provide a spin wave device that can be integrated into a LSI circuit and has a high degree of freedom in setting frequency characteristics.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A spin wave device comprising:
an input interconnect transmitting an input impulse signal;
a multilayer film including a foundation layer;
a first magnetic layer formed on the multilayer film, the first magnetic layer generating spin waves when receiving the input impulse signal, the spin waves propagating through the first magnetic layer;
a plurality of input electrodes arranged in a straight line on the first magnetic layer, the input electrodes being connected to the input interconnect, the input electrodes transmitting the input impulse signal to the first magnetic layer; and
a plurality of sensing electrodes sensing the spin waves having propagated through the first magnetic layer, the sensing electrodes being arranged on the first magnetic layer, the sensing electrodes being located at different distances from one another from the straight line having the input electrodes arranged therein, wherein the following equation is satisfied:

$$d = Vg \times t_0$$

where n (n≥2) represents the number of the sensing electrodes, L, represents a distance of the ith (n≥i≥1) sensing electrode from the straight line, Vg represents a group velocity of the spin waves, $t_0$ represents a pulse period of the input impulse signal, and d represents a distance between the ith (n−1≥i≥1) sensing electrode and the (i+1)th sensing electrode adjacent to the ith sensing electrode in a direction perpendicular to the straight line.

2. The device according to claim 1, wherein the multilayer film includes a spacer layer adjacent to the first magnetic layer and a second magnetic layer adjacent to the spacer layer, the second magnetic layer having a pinned magnetization direction.

3. The device according to claim 2, wherein the spacer layer is a tunnel barrier layer.

4. The device according to claim 2, wherein the spacer layer is a nonmagnetic conductive layer.

5. The device according to claim 1, wherein each of the input electrodes includes a spacer layer adjacent to the first magnetic layer and a second magnetic layer adjacent to the spacer layer, the second magnetic layer having a fixed magnetization direction.

6. The device according to claim 1, wherein each of the sensing electrodes includes a spacer layer adjacent to the first magnetic layer and a second magnetic layer adjacent to the spacer layer, the second magnetic layer having a fixed magnetization direction.

7. The device according to claim 1, further comprising
two output interconnects,
wherein the sensing electrodes are connected to the two output interconnects at different connecting points from one another.

8. The device according to claim 1, wherein a tunnel barrier layer is provided between each of the sensing electrodes and the first magnetic layer.

* * * * *